United States Patent
Sass et al.

(10) Patent No.: US 8,519,274 B2
(45) Date of Patent: Aug. 27, 2013

(54) PIN THAT INSERTS INTO A CIRCUIT BOARD HOLE

(75) Inventors: Tony C. Sass, Fuquay Varina, NC (US); Paul A. Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 156 days.

(21) Appl. No.: 13/042,924

(22) Filed: Mar. 8, 2011

(65) Prior Publication Data

US 2012/0228016 A1    Sep. 13, 2012

(51) Int. Cl.
*H05K 1/11* (2006.01)

(52) U.S. Cl.
CPC .......................................... *H05K 1/11* (2013.01)
USPC ............................................. 174/261; 174/260

(58) Field of Classification Search
CPC ....................................................... H05K 1/11
USPC .................. 174/260, 261, 262–265; 439/81, 439/82, 857, 856
See application file for complete search history.

(56) References Cited

U.S. PATENT DOCUMENTS

| | | | |
|---|---|---|---|
| 3,820,061 A * | 6/1974 | Holden | 439/825 |
| 5,135,403 A | 8/1992 | Rinaldi | |
| 5,181,854 A | 1/1993 | Masuda | |
| 5,374,204 A | 12/1994 | Foley et al. | |
| 5,509,814 A | 4/1996 | Mosquera | |
| 5,653,598 A * | 8/1997 | Grabbe | 439/66 |
| 6,098,281 A * | 8/2000 | Rudi | 29/845 |
| 6,388,208 B1 * | 5/2002 | Kiani et al. | 174/266 |
| 7,090,503 B2 | 8/2006 | Dittmann | |
| 7,263,771 B2 | 9/2007 | Ochiai | |
| 7,344,389 B2 * | 3/2008 | Kramski | 439/82 |
| 7,354,276 B2 | 4/2008 | Dittmann | |
| 7,758,351 B2 | 7/2010 | Brown et al. | |
| 2009/0011642 A1 * | 1/2009 | Amleshi et al. | 439/608 |

* cited by examiner

*Primary Examiner* — Yuriy Semenenko
(74) *Attorney, Agent, or Firm* — Edward J. Lenart; Cynthia G. Seal; Biggers & Ohanian, LLP

(57) ABSTRACT

A pin and a method of establishing contact between a pin and plating of a circuit board hole is provided. Embodiments include a pin comprising a pair of outwardly biased flexible beams that each extend from a body of the pin, the flexible beams connected at one end to one another at the body of the pin and separated from each other at an end opposite the end connected to the body, the separation between the pair of flexible beams forming an open slot, each flexible beam including a contact point that contacts the plating of the hole when the pin is inserted into the circuit board hole.

16 Claims, 3 Drawing Sheets

Inserting A Pin Into A Circuit Board Hole, The Pin Including A Pair Of Outwardly Biased Flexible Beams That Each Extend From A Body Of The Pin, The Flexible Beams Connected At One End To One Another At The Body Of The Pin And Separated From Each Other At An End Opposite The End Connected To The Body, The Separation Between The Pair Of Flexible Beams Forming An Open Slot, Each Flexible Beam Including A Contact Point That Contacts The Plating Of The Hole When The Pin Is Inserted Into The Circuit Board Hole
202

Optimizing The Beam Thickness Of Each Of The Flexible Beams With Respect To The Diameter Of The Circuit Board Hole
204

Optimizing The Slot With Respect To The Diameter Of The Circuit Board Hole
206

Optimizing The Length Of The Flexible Beams To Reduce Engagement Force And Deformation Of The Body Of The Pin As The Pin Is Inserted Into The Circuit Board Hole
208

FIG. 2

PIN THAT INSERTS INTO A CIRCUIT BOARD HOLE

BACKGROUND OF THE INVENTION

1. Field of the Invention

The field of the invention is a pin and a method of establishing contact between a pin and a plating of a circuit board hole.

2. Description of Related Art

Circuit boards include plated holes that act as conductors for transmitting electrical signals to electrical components of the circuit boards. A pin may be inserted into the circuit board hole to establish contact with the plating of the circuit board. However, the portion of the pin that is inserted into the hole creates a stub effect for signals transmitted on the conductors of the circuit board. The stub effect may result in impedance discontinuity and a disruption of the intended operation of the printed circuit board.

SUMMARY OF THE INVENTION

A pin that inserts into a circuit board hole is provided. Embodiments include a pair of outwardly biased flexible beams that each extend from a body of the pin, the flexible beams connected at one end to one another at the body of the pin and separated from each other at an end opposite the end connected to the body, the separation between the pair of flexible beams forming an open slot, each flexible beam including a contact point that contacts the plating of the hole when the pin is inserted into the circuit board hole.

A method of establishing contact between a pin and a plating of a circuit board hole is provided. Embodiments include inserting the pin into the circuit board hole, the pin comprising a pair of outwardly biased flexible beams that each extend from a body of the pin, the flexible beams connected at one end to one another at the body of the pin and separated from each other at an end opposite the end connected to the body, the separation between the pair of flexible beams forming an open slot, each flexible beam including a contact point that contacts the plating of the hole when the pin is inserted into the circuit board hole.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 2 sets forth a flow chart illustrating an example of a method of establishing contact between a pin and a plating of a circuit board hole.

DETAILED DESCRIPTION OF EXEMPLARY EMBODIMENTS

Figure 1A:
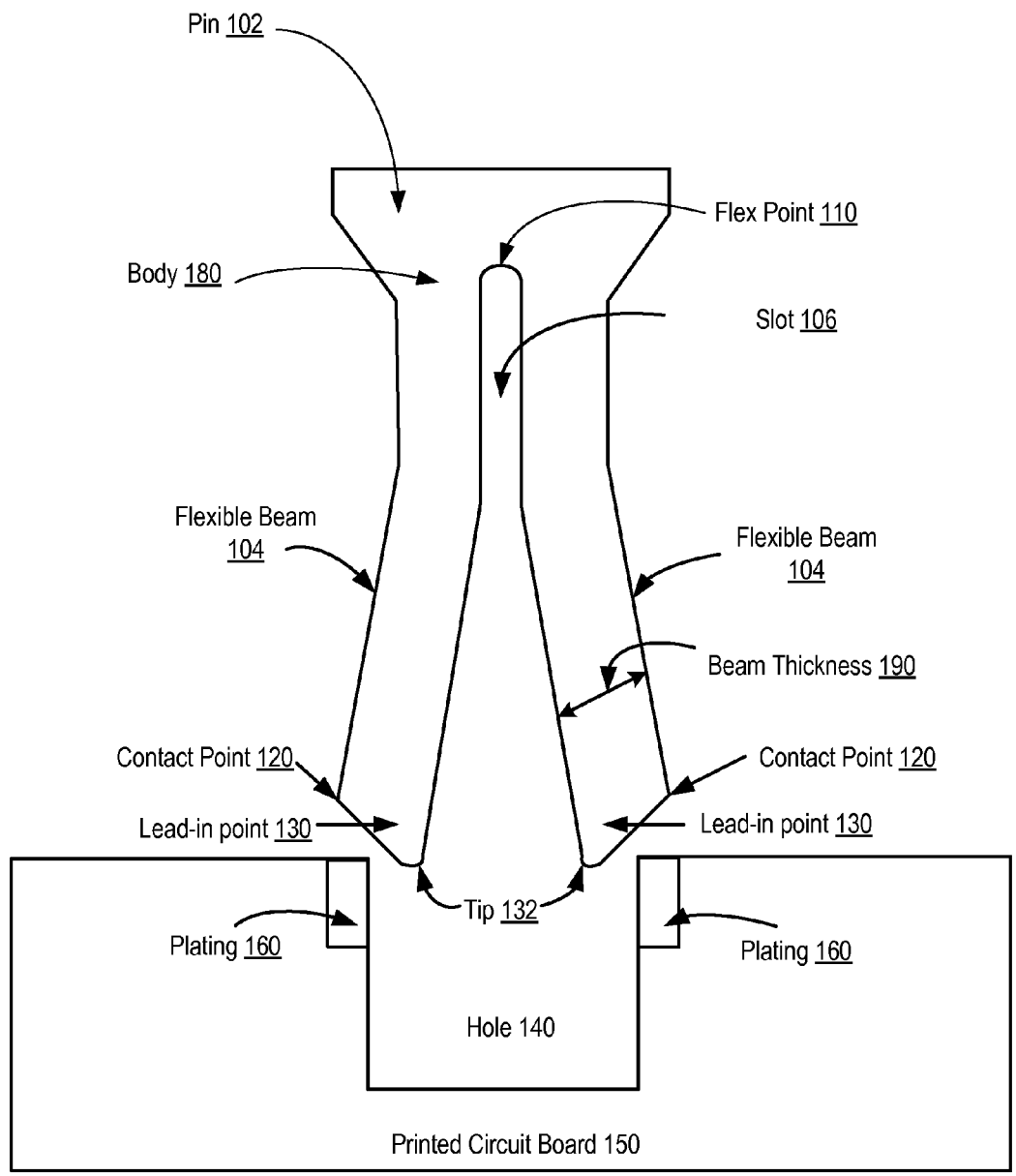
FIG. 1A sets forth a diagram of an example of a pin that inserts into a circuit board hole.

Examples of pins that inserts into circuit board holes in accordance with the present invention are described with reference to the accompanying drawings, beginning with FIG. 1. FIG. 1A sets forth a diagram of an example of a pin (102) that inserts into a hole (140) of a printed circuit board (150). The pin (102) of FIG. 1A is a compliant pin is a press-fit pin that contacts with plating (160) of the printed circuit board (150) when the pin (102) is inserted into the circuit board hole (140).

The pin (102) of FIG. 1A includes a pair of outwardly biased flexible beams (104) that each extend from a body (180) of the pin (102). The flexible beams (104) are connected at one end to one another at the body (180) of the pin (102) and separated from each other at an end opposite the end connected to the body (180). The body (180) and the flexible beams (104) of FIG. 1A may be a unibody piece of material. The flexible beams (104) are designed to flex inwards towards each other as the pin (102) is inserted into the hole (140). The separation between the pair of flexible beams (104) of FIG. 1A forms an open slot (106). The slot (106) is widest at the flexible beam ends that are opposite to the flexible beam ends connected to the body (180). The slot (106) controls the range that the flexible beams (104) may move as the pin (102) is inserted into the circuit board hole (140). In the example of FIG. 1A, the body (180) of the pin (102) includes a flex point (110) that contracts in response to the pair of flexible beams (104) flexing inwards towards each other.

Each flexible beam (104) including a contact point (120) that contacts plating (160) of the circuit board hole (140) when the pin (102) is inserted into the circuit board hole (140). The contact point (120) of FIG. 1A is a conductor that establishes an electrical connection with the plating (160) of the circuit board hole (140). The plating (160) of the circuit board hole (140) of FIG. 1A is used to transmit signals from the pin (120) to electrical components of the printed circuit board (150).

Each flexible beam (104) includes a lead-in portion (130) having a width that continuously narrows to a tip (132). In the example of FIG. 1A, each flexible beam (104) narrows from the contact point (120) to the tip (132). As the pin (102) is inserted into the circuit board hole (140), the pin (102) makes contact with the printed circuit board hole (140) first at the tip (132) until finally at the contact point (120).

The size and shape of the flexible beams (104) may be designed based on a size and shape of the circuit board hole (140). For example, each flexible beam (104) may be selected to have a particular size such that the distance between the tip (132) and the contact point (120) is minimized. Minimizing the lead-in point (130) of the flexible beams (104) reduces the amount of the pin (102) that is within the hole (140) of the printed circuit board (150) when the pin (102) is inserted. Reducing the lead-in point (130) reduces the stub effect created by the pin, thus decreasing the impact of the pin (102) on the performance of the printed circuit board (150).

Figure 1B:
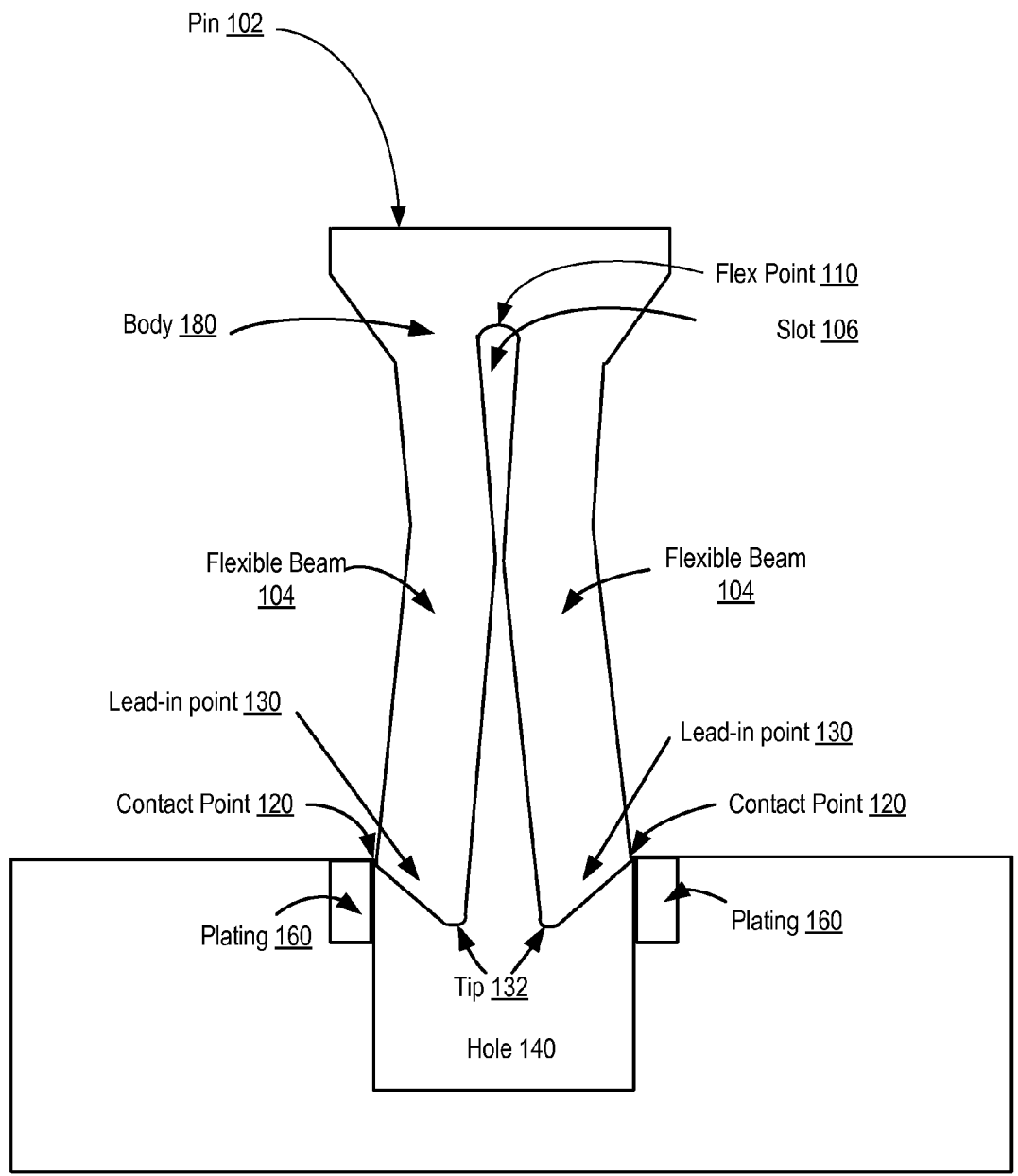
FIG. 1B sets forth a diagram of the pin of FIG. 1A inserted into a circuit board hole.

FIG. 1B sets forth a diagram of the pin of FIG. 1A inserted into a circuit board hole. That is, the pin (102) of FIG. 1B includes the following components of the pin (102) of FIG. 1A: the body (180), the pair of flexible beams (104), the slot (106), the contact points (120), the lead-in portion (130), and the tips (132). When the pin (102) is inserted into the circuit board hole (140), the pair of flexible beams (104) move inwards towards each other such that the slot (106) narrows. That is, the slot narrows in response to the flexible beams (104) contacting the sides of the circuit board hole (140) as the pin (102) is inserted into the circuit board hole (140). The range that the slot (106) narrows and expands may be selected to correspond to a range of circuit board hole diameters.

For further explanation, FIG. 2 sets forth a flow chart illustrating an example of a method of establishing contact between a pin and a plating of a circuit board hole. The method of FIG. 2 includes inserting (202) the pin into the circuit board hole. Inserting (202) the pin into the circuit board hole may be carried out by aligning the pin with the circuit board hole and applying a force to the body of the pin such that the lead-in point of the pin connects with the circuit board hole and the flexible beams flex inwards toward each other until the contact point of the flexible beams contacts the plating of the circuit board hole.

The method of FIG. 2 includes optimizing (204) the beam thickness of the flexible beams with respect to the diameter of the circuit board hole. Optimizing (204) the beam thickness of the flexible beams with respect to the diameter of the circuit board hole may be carried out by selecting a beam thickness of the flexible beams such that the distance between the flexible beams is minimal when the pin is inserted into the circuit board hole. In particular embodiments, the thickness of the flexible beams may be optimized such that the flexible beams form an airtight connection when the pin is inserted into the circuit board hole.

The method of FIG. 2 includes optimizing (206) the slot with respect to the diameter of the circuit board hole. Optimizing (206) the slot with respect to the diameter of the circuit board hole may be carried out by selecting a separation distance between the flexible beams such that the flexible beams can flex inwards and outwards to accommodate a particular range of circuit board holes.

The method of FIG. 2 includes optimizing (208) the length of the flexible beams to reduce engagement force and deformation of the body of the pin as the pin is inserted into the circuit board hole. Optimizing (208) the length of the flexible beams to reduce engagement force and deformation of the body of the pin may be carried out by selecting a particular length of the flexible beams such that the flexible beams exert a particular force on the sides of the circuit board hole.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A pin that inserts into a circuit board hole having a diameter and a plating therein, the pin comprising:
   a pair of outwardly biased flexible beams that each extend from a body of the pin, the flexible beams connected at one end to one another at the body of the pin and separated from each other at an end opposite the end connected to the body, the separation between the pair of flexible beams forming an open slot, each flexible beam including a contact point that contacts the plating of the hole when the pin is inserted into the circuit board hole, wherein each flexible beam has a beam thickness, wherein the beam thickness is optimized with respect to the diameter of the circuit board hole.

2. The pin of claim 1, wherein the slot between the pair of flexible beams is widest at the flexible beam ends that are opposite to the flexible beam ends connected to the body.

3. The pin of claim 1, wherein the slot narrows in response to the flexible beams contacting the sides of the circuit board hole as the pin is inserted into the circuit board hole.

4. The pin of claim 3, wherein the range that the slot narrows and expands is selected to correspond to a range of circuit board hole diameters.

5. The pin of claim 1, wherein the slot is optimized with respect to the diameter of the circuit board hole.

6. The pin of claim 1, wherein the length of the flexible beams are optimized to reduce engagement force and deformation of the board of the pin as the pin is inserted into the circuit board hole.

7. The pin of claim 1, wherein each flexible beam includes a lead-in portion that continuously narrows to a tip, wherein each flexible beam narrows from the contact point to the tip.

8. The pin of claim 1, wherein the pin is a compliant pin.

9. A method of establishing contact between a pin and a plating of a circuit board hole, the method comprising:
   inserting the pin into the circuit board hole, the pin comprising a pair of outwardly biased flexible beams that each extend from a body of the pin, the flexible beams connected at one end to one another at the body of the pin and separated from each other at an end opposite the end connected to the body, the separation between the pair of flexible beams forming an open slot, each flexible beam including a contact point that contacts the plating of the hole when the pin is inserted into the circuit board hole, wherein each flexible beam has a beam thickness; further comprising optimizing the beam thickness with respect to the diameter of the circuit board hole.

10. The method of claim 9, wherein the slot between the pair of flexible beams is widest at the flexible beam ends that are opposite to the flexible beam ends connected to the body.

11. The method of claim 9, wherein the slot narrows in response to the flexible beams contacting the sides of the circuit board hole as the pin is inserted into the circuit board hole.

12. The method of claim 11, wherein the range that the slot narrows and expands is selected to correspond to a range of circuit board hole diameters.

13. The method of claim 9, further comprising optimizing the slot with respect to the diameter of the circuit board hole.

14. The method of claim 9, further comprising optimizing the length of the flexible beams to reduce engagement force and deformation of the body of the pin as the pin is inserted into the circuit board hole.

15. The method of claim 9, wherein each flexible beam includes a lead-in portion having a lead-in profile, wherein a width of said lead-in profile continuously narrows to a tip, wherein each flexible beam narrows from the contact point to the tip.

16. The method of claim 9, wherein the pin is a compliant pin.

* * * * *